(12) United States Patent
Ishihara

(10) Patent No.: US 7,400,132 B2
(45) Date of Patent: Jul. 15, 2008

(54) CURRENT SENSOR AND METHOD OF MANUFACTURING THE SAME

(75) Inventor: Masato Ishihara, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/586,556

(22) Filed: Oct. 26, 2006

(65) Prior Publication Data

US 2007/0096717 A1   May 3, 2007

(30) Foreign Application Priority Data

Oct. 31, 2005   (JP) .............................. 2005-317459

(51) Int. Cl.
*G01R 33/07* (2006.01)
*G01R 33/06* (2006.01)
*H03K 3/59* (2006.01)
*H03K 17/97* (2006.01)

(52) U.S. Cl. .................. 324/117 H; 324/251; 327/511; 338/32 H

(58) Field of Classification Search ............. 324/117 H, 324/251; 327/511; 338/32 H
See application file for complete search history.

(56) References Cited

U.S. PATENT DOCUMENTS

| | | | | |
|---|---|---|---|---|
| 4,823,075 A | * | 4/1989 | Alley ...................... | 324/117 H |
| 4,843,310 A | * | 6/1989 | Friedl ......................... | 324/127 |
| 5,023,684 A | * | 6/1991 | Tsunoda ..................... | 257/423 |
| 5,070,317 A | * | 12/1991 | Bhagat ........................ | 336/200 |
| 5,874,848 A | * | 2/1999 | Drafts et al. ................. | 327/511 |
| 5,990,533 A | * | 11/1999 | Hasegawa .................... | 257/421 |
| 6,054,329 A | * | 4/2000 | Burghartz et al. .............. | 438/3 |
| 6,686,730 B2 | * | 2/2004 | Marasch et al. ......... | 324/117 R |
| 6,791,313 B2 | * | 9/2004 | Ohtsuka ................. | 324/117 H |
| 6,817,760 B2 | * | 11/2004 | Mende et al. ............... | 374/152 |
| 7,084,617 B2 | * | 8/2006 | Ozaki et al. ............. | 324/117 H |
| 2003/0001559 A1 | * | 1/2003 | Goto et al. ............. | 324/117 H |
| 2006/0226826 A1 | * | 10/2006 | Teppan ................... | 324/117 H |

FOREIGN PATENT DOCUMENTS

| | | |
|---|---|---|
| JP | A-5-196651 | 8/1993 |
| JP | A-6-82486 | 3/1994 |
| JP | A-6-130088 | 5/1994 |
| JP | A-7-218552 | 8/1995 |
| JP | A-2002-148284 | 5/2002 |

* cited by examiner

*Primary Examiner*—Ha Nguyen
*Assistant Examiner*—Karen M Kusumakar
(74) *Attorney, Agent, or Firm*—Posz Law Group, PLC

(57) ABSTRACT

A current sensor includes a semiconductor substrate, a ring shaped magnetic core having a center opening and a gap and provided to a surface of the substrate, and a Hall element provided to the surface and placed in the gap of the magnetic core such that a control current for operating the Hall element flows perpendicular to the surface of the substrate. The magnetic core and the Hall element are formed to the substrate by semiconductor manufacturing techniques. Therefore, the Hall element can be placed in the gap to be accurately positioned with respect to the magnetic core and the gap can have a reduced separation distance. Thus, the current sensor can have an increased sensitivity and accurately measure a current to be detected.

13 Claims, 4 Drawing Sheets

CURRENT SENSOR AND METHOD OF MANUFACTURING THE SAME

CROSS REFERENCE TO RELATED APPLICATION

This application is based on and incorporates herein by reference Japanese Patent Application No. 2005-317459 filed on Oct. 31, 2005.

FIELD OF THE INVENTION

The present invention relates to a current sensor and a method of manufacturing the current sensor.

BACKGROUND OF THE INVENTION

A current sensor has been proposed that detects a current based on characteristics of a Hall element, which is a semiconductor element. When a control current flows through the Hall element and a magnetic field is applied to the Hall element in a direction perpendicular to the control current flow direction, a Hall effect occurs and a Hall voltage is induced across the Hall element.

When a current to be detected flows through a conductor, the magnetic field is generated around the conductor in a direction perpendicular to the detected current flow direction. The magnetic field changes proportional to the amount of the detected current. Therefore, the detected current can be measured by the Hall element placed near the conductor. Specifically, the detected current can be measured based on the Hall voltage generated by the Hall element that is placed near the conductor such that the control current flow direction is parallel to the detected current flow direction.

Typically, the Hall element and peripheral circuits are integrated into a Hall IC. The use of the Hall IC reduces the size and manufacturing cost of the current sensor.

In the current sensor using the Hall IC, a portion of the magnetic flux induced around the conductor by the current leaks so that the whole magnetic field is not applied to the Hall IC. As a result, the current sensor may not accurately detect the current.

To overcome the above problem, a current sensor with a magnetic core has been proposed and used in practice. The magnetic core is made of a magnetic material such as permalloy and concentrates the magnetic flux. For example, in a current sensor disclosed in JP-2002-148284A, the magnetic core is installed in a case by insert molding technology and then a circuit board having the Hall IC is placed in the case.

In such a current sensor having the magnetic core, the positional relationship between the magnetic core and the Hall IC affects the strength of the magnetic field around the Hall element. Therefore, the current sensor requires high assembly precision. Even if the requirement for the high assembly precision is met, the positional relationship may change over time due to, for example, change in the ambient temperature. As a result, the current sensor may not accurately detect the current.

The current sensor needs to detect a small current, i.e., needs high sensitively, because recent development trends are toward low power consumption. In the current sensor, the Hall IC is placed in a gap of the magnetic core and the magnetic flux flowing through the magnetic core is applied to the Hall element of the Hall IC. The sensitivity of the current sensor can be increased by reducing a gap separation distance in order to increase the magnitude of the magnetic flux applied to the Hall IC.

However, since the Hall element is integrated in the Hall IC, the gap separation distance may be limited to the thickness of the Hall IC. Further, when the Hall IC is placed in the gap with the reduced separation distance, the assembly precision may need to be further improved.

SUMMARY OF THE INVENTION

In view of the above-described problem, it is an object of the present invention to provide a current sensor that includes a magnetic core having a gap with a reduced separation distance therein and includes a Hall element placed in the gap to be accurately positioned with respect to the magnetic core, and to provide a method of manufacturing the current sensor.

A current sensor includes a semiconductor substrate, a ring shaped magnetic core having a center opening and a gap and provided to a surface of the substrate, and a Hall element placed in the gap of the magnetic core.

In the current sensor, a control current for operating the Hall element flows in a direction perpendicular to the surface of the substrate, i.e., flows in a thickness direction of the substrate. When a current to be detected flows in a direction along an axis of the magnetic core, a magnetic field induced by the detected current is concentrated by the magnetic core. Since the magnetic field is perpendicular to the flow direction of the control current, a Hall voltage depending on the amount of the detected current is induced across the Hall element. Thus, the current sensor measures the detected current based on the Hall voltage.

The magnetic core and the Hall element are formed to the substrate by semiconductor manufacturing techniques. Therefore, the Hall element can be placed in the gap to be accurately positioned with respect to the magnetic core and the gap can have a reduced separation distance. Thus, the current sensor can have an increased sensitivity and accurately measure the detected current.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1A:
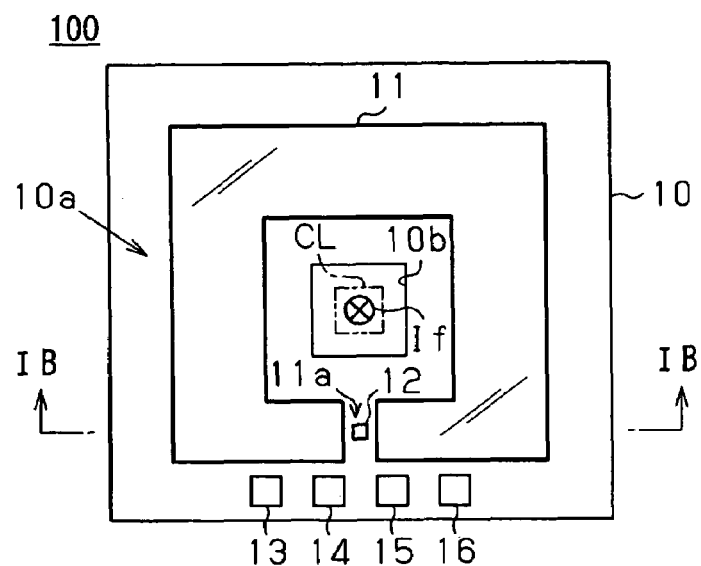
FIG. 1A is a plan view showing a current sensor according to a first embodiment of the present invention.
Figure 1B:
FIG. 1B is a cross sectional view showing the sensor taken along line IB-IB in FIG. 1A.

Referring to FIGS. 1A and 1B, a current sensor 100 includes a semiconductor substrate 10 with a surface 10a and a center hole 10b, a ring-shaped magnetic core 11 with a gap 11a, a vertical Hall element 12.

The center hole 10b penetrates through the substrate 10 in a thickness direction of the substrate 10. A conductor CL through which a current If to be detected flows is inserted through the center hole 10b. The magnetic core 11 is made of a magnetic material such as permalloy and formed to the surface 10a to surround the center hole 10b. The Hall element 12 is placed in the gap 11a such that a control current Ib shown in FIG. 2B flows in a direction perpendicular to the surface 10a. The Hall element 12 has terminals electrically connected to wire bonding pads 13-16 formed on the surface 10a.

Figure 2A:
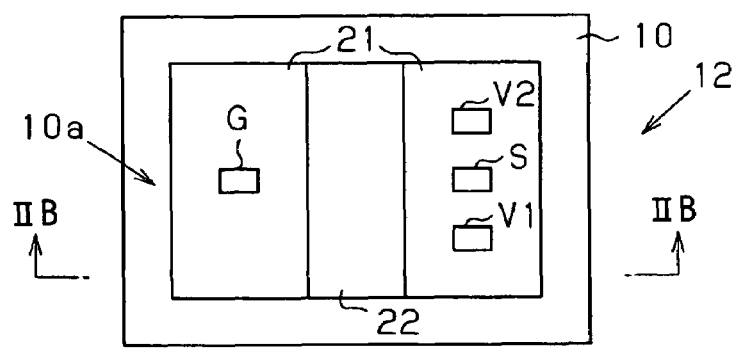
FIG. 2A is a plan view showing a vertical Hall element used in the sensor according to the first embodiment.
Figure 2B:
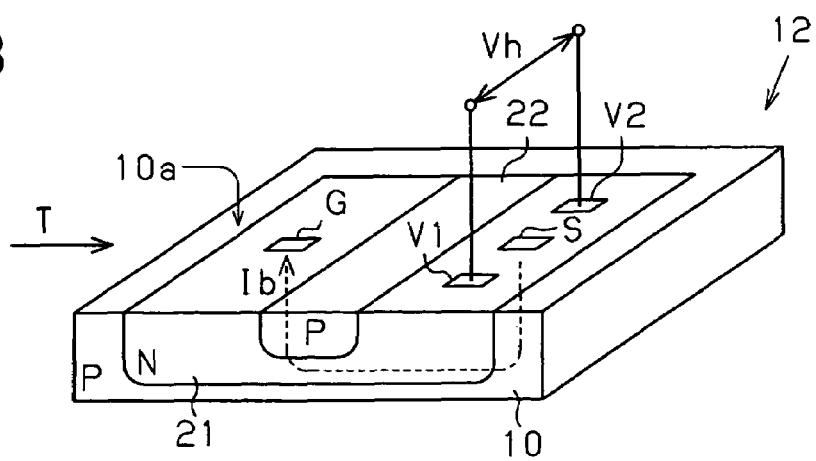
FIG. 2B is a cross sectional view showing the Hall element taken along line IIB-IIB in FIG. 2A.

FIGS. 2A and 2B illustrate the Hall element 12 in detail.

As shown in FIG. 2B, when the control current Ib having a perpendicular component to the surface 10a is supplied to the Hall element 12 and a magnetic field T is applied to the Hall element 12 in a direction parallel to the surface 10a, a Hall voltage Vh depending on the magnetic field T is induced across the Hall element 12.

For example, when the substrate 10 is a P-type semiconductor substrate, the Hall element 12 is constructed such that an N-type well layer 21 is created in the substrate 10 and is divided into first and second regions by a P-type well layer 22. As shown in FIG. 2B, the P-type well layer 22 extends in the thickness direction of the substrate 10, i.e., the direction perpendicular to the surface 10a in the center of the N-type well layer 21 and is nearly rectangular in cross section. The P-type well layer 22 divides the N-type well layer 21 into the first and second regions only in the upper center of the N-type well layer 21.

An input terminal S for the control current Ib is formed on a surface of the first region of the N-type well layer 21 to form ohmic contact with the N-type well layer 21. An output terminal G for the control current Ib is formed on a surface of the second region of the N-type well layer 21 to form ohmic contact with the N-type well layer 21. Detection terminals V1, V2 used to detect the Hall voltage Vh are formed on the surface of the first region of the N-type well layer 21 to form ohmic contact with the N-type well layer 21. As shown in FIG. 2A, the input terminal S is interposed between the detection terminals V1, V2 along a length of the P-type well layer 22. The input terminal S, the output terminal G, and the detection terminals V1, V2 are electrically connected to the wire bonding pads 13-16, respectively.

When the control current Ib is supplied to the Hall element 12 through the wire bonding pads 13, 14, the control current Ib flows in the N-type well layer 21 along the P-type well layer 22. Specifically, in the N-type well layer 21, the control current Ib flows in a downward direction perpendicular to the surface 10a first. Then, the control current Ib flows in a direction parallel to the surface 10a and then flows in an upward direction perpendicular to the surface 10a.

When the control current Ib flows in the N-type well layer 21 in the direction perpendicular to the surface 10a and the magnetic field T is applied to the Hall element 12 in the direction parallel to the surface 10a, the Hall elect occurs and the Hall voltage Vh is induced across the Hall element 12 in a direction perpendicular to the flow of the control current Ib. The Hall voltage Vh is detected as a voltage between the detection terminals V1, V2 and the magnetic field T is measured based on the Hall voltage Vh.

When the detected current If flows through the conductor CL, a magnetic field is induced around the conductor CL. The magnetic core 11 concentrates the induced magnetic field to produce the magnetic field T. Therefore, the detected current If can be measured by detecting the Hall voltage Vh.

Figure 3A:
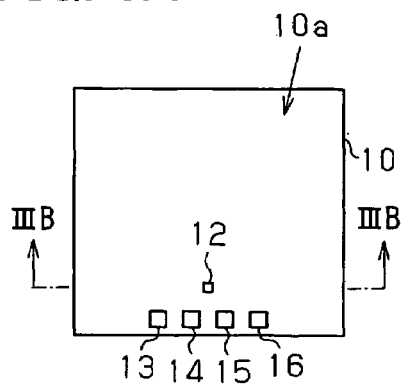
FIGS. 3A-6B are views showing processes for manufacturing the sensor according to the first embodiment.
Figure 3B:
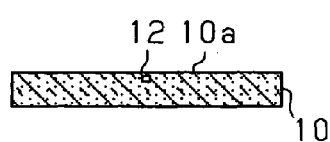

Referring to FIGS. 3A-6B, the current sensor 100 is manufactured as follow:

First, as shown in FIGS. 3A and 3B, the substrate 10 is prepared. The Hall element 12 is formed to the surface 10a of the substrate 10 such that a current channel for the control current Ib is perpendicular to the surface 10a. The wire bonding pads 13-16 are formed on the surface 10a of the substrate 10. The input terminal S, the output terminal G, and the detection terminals V1, V2 of the Hall element 12 are electrically connected to the wire bonding pads 13-16.

Figure 4A:
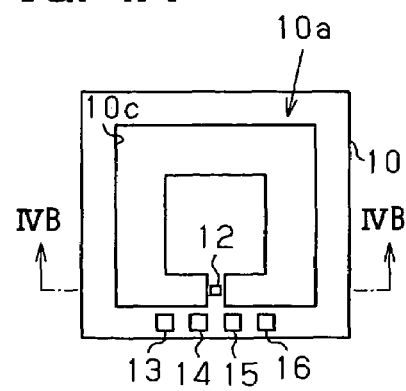
Figure 4B:
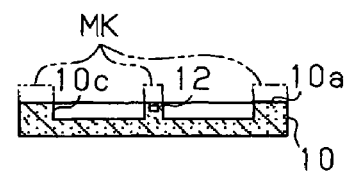

Next, as shown in FIGS. 4A and 4B, a ring shaped trench 10c is formed to the surface 10a such that a region where the Hall element 12 is formed is sandwiched between ends of the trench 10c. Specifically, a mask MK with an aperture having the same shape as the trench 10c is placed on the surface 10a and then pattern-etching is applied to form the trench 10c.

Figure 5A:
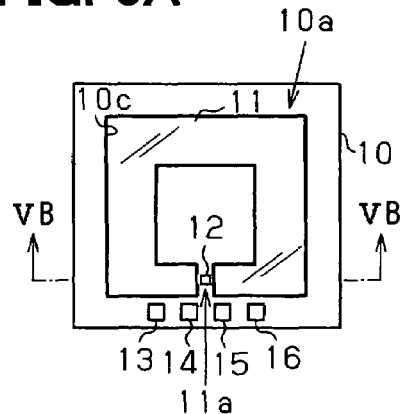
Figure 5B:
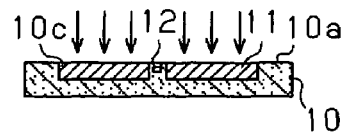

Then, as shown in FIGS. 5A and 5B, the magnetic material such as the permalloy is deposited in the trench 10c from a direction indicated by an arrow in FIG. 5B. Thus, the trench 10c is filled with the magnetic material and the magnetic core 11 with the gap 11a is formed to the surface 10a of the substrate 10. The Hall element 12 is positioned in the gap 11a.

Figure 6A:
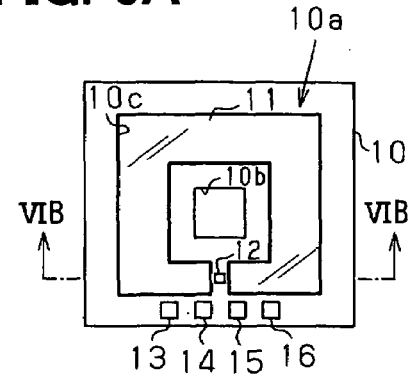
Figure 6B:
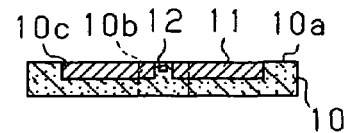

Next, as shown in FIGS. 6A and 6B, the center hole 10b penetrating through the substrate 10 in the thickness direction of the substrate 10 is formed in the area bounded by an inner edge of the magnetic core 11.

Thus, the current sensor 100 is finished. Actually, the current sensor 100 is molded with resin in post-process to have an increased structural strength and resistance to rust.

As described above, the current sensor 100 is manufactured by semiconductor manufacturing techniques. Therefore, the Hall element 12 can be placed in the gap 11a to be accurately positioned with respect to the magnetic core 11.

Figure 7A:
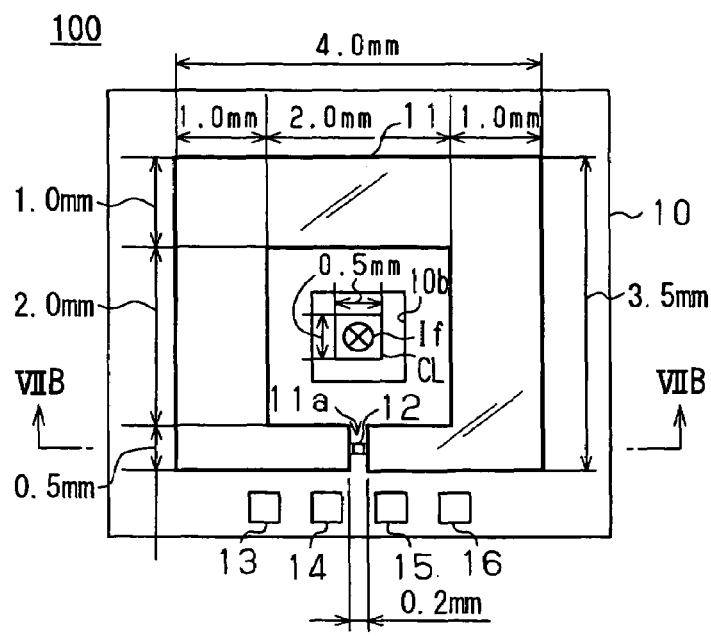
FIG. 7A is a plan view showing the sensor with a conductor through which a current to be detected flows.
Figure 7B:
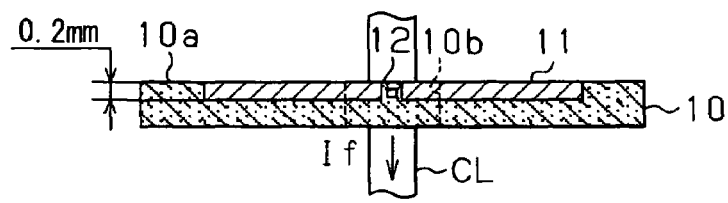
FIG. 7B is a cross sectional view showing the sensor taken along line VIIB-VIIB in FIG. 7A.

As shown in FIGS. 7A and 7B, the conductor CL is inserted through the center hole 10b to be perpendicular to the surface 10a of the substrate 10. Thus, the detected current If flowing through the conductor CL flows perpendicular to the surface 10a. Therefore, the current sensor 100 can measure the detected current If.

The inventor has tested the current sensor 100 shown in FIGS. 7A and 7B. The current sensor 100 used in the test includes the magnetic core 11 having outer dimension of 4.0 millimeters (mm)×3.5 mm, inner dimension of 2.0 mm×2.0 mm, and thickness of 0.2 mm. The gap 11a has a width of 0.5 mm and a separation distance of 0.2 mm. The test result shows that the current sensor 100 has a sensitivity of 6.0 millitesla per ampere (mT/A), which corresponds to ten times higher than a sensitivity of the conventional current sensor. Therefore, even when the detected current If is small, the current sensor 100 can accurately measure the detected current If.

As described above, in the current sensor 100 according to the first embodiment, the magnetic core 11 and the Hall element 12 are formed to the substrate 10. The magnetic core 11 is formed by depositing the magnetic material in the trench 10c formed to the substrate 10. In such an approach, the position of the magnetic core 11 is determined by the position of the trench 10c so that the Hall element 12 can be accurately positioned with respect to the magnetic core 11.

Since the Hall element 12 is formed in the substrate 10, the gap 11a, where the Hall element 12 is placed, can have a reduced separation distance. The gap 11a with the reduced separation distance improves the sensitivity of the current sensor 100.

Second Embodiment

Referring to FIGS. 8A-9D, a current sensor 200 includes a semiconductor substrate 30 with a surface 30a, the magnetic core 11, and the Hall element 12.

Figure 8A:
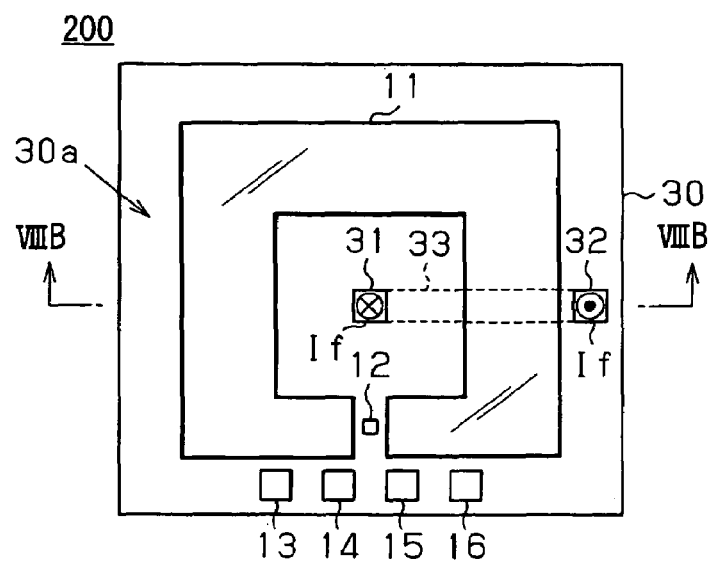
FIG. 8A is a plan view showing a current sensor according to a second embodiment of the present invention.

First and second connection terminals 31, 32 are formed on the surface 30a of the substrate 30. As shown in FIG. 8A, the first and second connection terminals 31, 32 are positioned inside and outside the magnetic core 11, respectively. Specifically, the first and second connection terminals 31, 32 are positioned on the opposite side of the magnetic core 11.

Figure 8B:
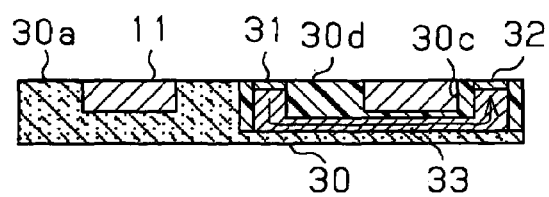
FIG. 8B is a cross sectional view showing the sensor taken along line VIIIB-VIIIB in FIG. 8A.

As shown in FIG. 8B, a conductive member 33 for electrically connecting the first and second connection terminals 31, 32 is formed in the substrate 30 to pass under the magnetic core 11. The conductive member 33 has first and second end portions 33a, 33c (see, FIG. 9D) extending perpendicular to the surface 30a and a middle portion 33b (see, FIG. 9D) extending parallel to the surface 30a. The first and second end portions 33a, 33c are connected to the first and second connection terminals 31, 32, respectively. For example, the first and second connection terminals 31, 32 may be made of metal having good solder wettability and the conductive member 33 may be made of aluminum.

Referring to FIGS. 9A-9D, the current sensor 200 is manufactured as follow:

A difference between the manufacturing process for the current sensor 100 and a manufacturing process for the current sensor 200 is that the manufacturing process for the current sensor 200 includes a step for forming the conductive member 33 instead of the step for forming the center hole 10b. Therefore, only the step for the forming the conductive member 33 is described below.

Figure 9A:
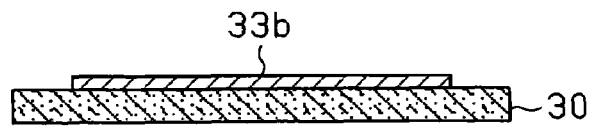
FIGS. 9A-9D are views showing processes for manufacturing the sensor according to the second embodiment.

First, as shown in FIG. 9A, the middle portion 33b of the conductive member 33 is formed on the substrate 30. The middle portion 33b has a length corresponding to a distance between the first and second connection terminals 31, 32 and has a width equal to a width of each of the first and second connection terminals 31, 32.

Figure 9B:
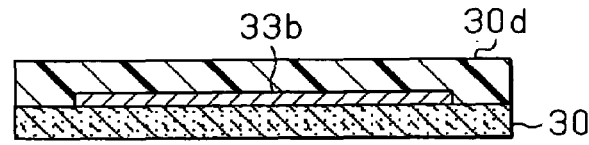

Next, as shown in FIG. 9B, an insulation film 30d is placed on the substrate 30 such that the middle portion 33b is interposed between the substrate 30 and the insulation film 30d.

Figure 9C:
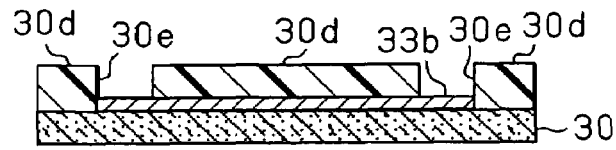

Then, as shown in FIG. 9C, trenches 30e are formed on the insulation film 30d such that end portions of the middle portion 33b are exposed through the insulation film 30d.

Figure 9D:
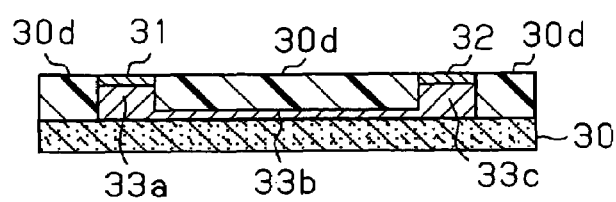

Then, as shown in FIG. 9D, the first end portion 33a is formed in one of the trenches 30e and the first connection terminal 31 is formed on the first end portion 33a. Likewise, the second end portion 33c is formed in the other of the trenches 30e and the second connection terminal 32 is formed on the second end portion 33c.

Thus, the conductive member 33 having the end portions 33a, 33c and the middle portion 33b is finished. After the conductive member 33 is finished, a trench 30c is formed such that the first and second connection terminals 31, 32 are positioned on the opposite side of the trench 30c. The magnetic core 11 is formed by depositing the magnetic material in the trench 30c.

When the detected current If flows between the first and second connection terminals 31, 32 through the conductive member 33, the detected current If flows perpendicular to the surface 30a inside the magnetic core 11. Therefore, the current sensor 200 can measure the detected current If.

As described above, in the current sensor 200 according to the second embodiment, the conductive member 33 for electrically connecting the first and second connection terminals 31, 32 is formed in the substrate 30 to pass under the magnetic core 11. The conductive member 33 has the first and second end portions 33a, 33c extending perpendicular to the surface 30a and the middle portion 33b extending parallel to the surface 30a.

When the detected current If is very small, not only a positional relationship between the magnetic core 11 and the Hall element 12, but also a positional relationship between the magnetic core 11 and the conductive member 33 affects accuracy in measurement. Since the conductive member 33 is formed in the substrate 30, the conductive member 33 can be accurately positioned with respect to the magnetic core 11. Thus, even if the detected current If is very small, the current sensor 200 can accurately measure the detected current If. The current sensor 200 can have a small size by reducing the cross section of the conductive member 33 in accordance with the amount of the detected current If.

Since the conductive member 33 is made of aluminum, the conductive member 33 can be easily formed and have excellent conductivity.

MODIFICATIONS

The embodiments described above may be modified in various ways. For example, the conductive member 33 may have only the first end portion 33a. In this case, the first end portion 33a extends to a back side of the substrate 30 and the second connection terminal 32 is formed on the back side of the substrate 30. In such an approach, the conductive member 33 can be easily formed in the substrate 30 so that the current sensor 200 can be easily manufactured.

The conductive member 33 may be made of conductive material other than aluminum.

Figure 10:
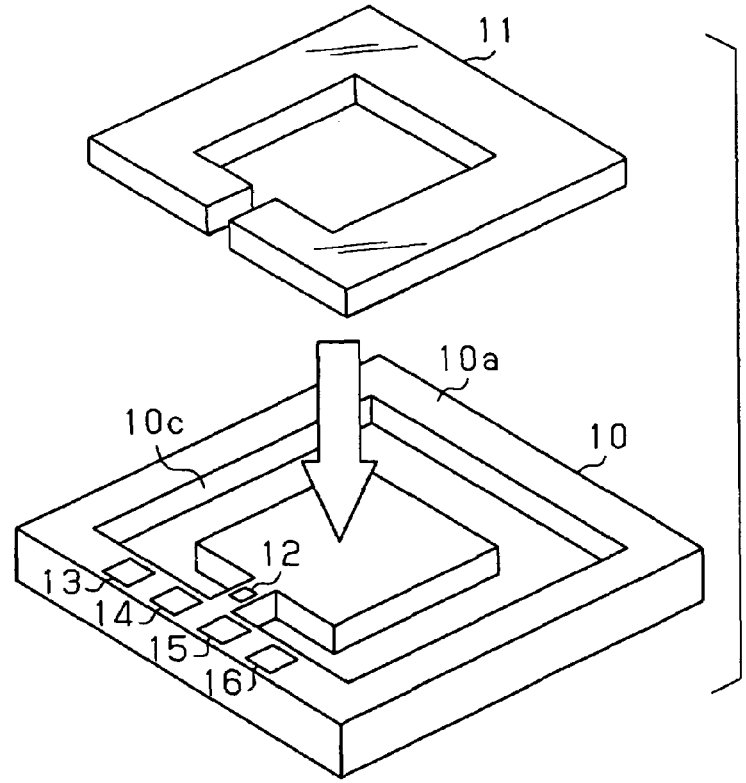
FIG. 10 is a perspective view showing a modification of the processes for manufacturing the sensor according to the first embodiment.

The magnetic core 11 having the same shape as the trench 10c (30c) may be formed in advance. In this case, the magnetic core 11 is bonded in the trench 10c (30c) as shown in FIG. 10.

The Hall element 12 may be a horizontal Hall element that is formed in the substrate 10 (30) such that the control current Ib flows in the thickness direction of the substrate 10 (30), i.e., in the direction perpendicular to the surface 10a (30a) of the substrate 10 (30). In short, various types of Hall elements can be used as the Hall element 12, as long as the control current Ib flows in the thickness direction of the substrate 10 (30).

Such changes and modifications are to be understood as being within the scope of the present invention as defined by the appended claims.

What is claimed is:

1. A current sensor comprising:
a semiconductor substrate with a surface and a ring shaped trench on the surface;
a ring shaped magnetic core with a center opening and a gap, the magnetic core being shaped corresponding to the trench and received in the trench of the substrate; and
a Hall element integrated in the substrate and placed in the gap of the magnetic core, the Hall element having a current channel through which a control current for operating the Hall element flows, wherein
at least a portion of the current channel is perpendicular to the surface of the substrate.

2. The current sensor according to claim 1, wherein
the substrate includes a hole portion penetrating therethrough in a direction perpendicular to the surface and positioned inside the center opening of the magnetic core.

3. The current sensor according to claim 1, wherein
the substrate includes a conductive member extending therethrough, and
at least a portion of the conductive member extends perpendicular to the surface of the substrate.

4. The current sensor according to claim 3, wherein
the conductive member is made of aluminum.

5. The current sensor according to claim 1, wherein
the Hall element is a vertical Hall element.

6. A method of manufacturing a current sensor, the method comprising:
integrating a Hall element in a semiconductor substrate to cause a flow of a control current for operating the Hall element in a direction perpendicular to a surface of the substrate;
forming a ring-shaped trench to the surface of the substrate to have end portions between which the Hall element is sandwiched; and
filling the trench with a magnetic material.

7. The method according to claim 6, wherein
the filling step includes depositing the magnetic material in the trench.

8. The method according to claim 6, wherein
the filling step includes forming a magnetic core with the magnetic material and bonding the magnetic core in the trench.

9. The method according to claim 6, further comprising:
forming a hole penetrating through the substrate inside the trench.

10. The method according to claim 6, further comprising:
forming a conductive member in the substrate to extend perpendicular to the surface of the substrate inside the trench, pass under the trench, and reach outside the trench.

11. The method according to claim 6, wherein
the Hall element is a vertical Hall element.

12. The current sensor according to claim 1, further comprising:
a conductive member integrated in the substrate,
wherein the conductive member extends perpendicular to the surface of the substrate inside the trench, pass under the trench, and reach outside the trench.

13. The current sensor according to claim 1, wherein a depth of the trench is substantially equal to a thickness of the magnetic core.

* * * * *